United States Patent
Wu

(10) Patent No.: US 8,242,594 B2
(45) Date of Patent: Aug. 14, 2012

(54) CHIP PACKAGE STRUCTURE AND MANUFACTURING METHOD THEREOF FOR EFFECTIVELY LOWERING MANUFACTURING COSTS AND IMPROVING YIELD AND RELIABILITY OF THE CHIP PACKAGE STRUCTURE

(75) Inventor: Chung-Pan Wu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 417 days.

(21) Appl. No.: 12/542,154

(22) Filed: Aug. 17, 2009

(65) Prior Publication Data

US 2010/0264534 A1 Oct. 21, 2010

(30) Foreign Application Priority Data

Apr. 17, 2009 (TW) ................................ 98112809 A

(51) Int. Cl.
 H01L 23/34 (2006.01)
 H01L 23/48 (2006.01)
 H01L 21/44 (2006.01)
(52) U.S. Cl. .................. 257/707; 257/784; 438/617
(58) Field of Classification Search .......... 257/707; 438/617
See application file for complete search history.

(56) References Cited

U.S. PATENT DOCUMENTS

| 4,096,983 | A | 6/1978 | Beilein et al. |
| 6,727,579 | B1 * | 4/2004 | Eldridge et al. ............ 257/692 |
| 7,314,820 | B2 * | 1/2008 | Lin et al. ................. 438/617 |
| 7,820,913 | B2 * | 10/2010 | Uno et al. ................... 174/94 R |
| 2007/0048999 | A1 * | 3/2007 | Farnworth ................ 438/612 |
| 2009/0194854 | A1 * | 8/2009 | Tan et al. .................... 257/666 |

FOREIGN PATENT DOCUMENTS

| CN | 101123286 | 2/2008 |
| JP | 2000-77589 | 3/2000 |
| TW | 534456 | 5/2003 |
| TW | I239628 | 9/2005 |
| TW | I280367 | 5/2007 |

OTHER PUBLICATIONS

"1st Office Action of China Counterpart Application", issued on Aug. 25, 2011, p1-p5.

* cited by examiner

Primary Examiner — James Mitchell
(74) Attorney, Agent, or Firm — J.C. Patents

(57) ABSTRACT

A chip package structure includes a circuit substrate, a chip, at least one bonding wire, and an adhesive layer. The circuit substrate has a bonding surface and at least one pad disposed on the bonding surface. The chip is disposed on the bonding surface of the circuit substrate and has an active surface away from the circuit substrate and at least one contact pad disposed on the active surface. The bonding wire is connected between the contact pad and the pad, such that the chip is electrically connected to the circuit substrate through the bonding wire. The bonding wire includes a copper layer, a nickel layer covering the copper layer, and a gold layer covering the nickel layer. The adhesive layer is disposed between the pad and the bonding wire and between the contact pad and the bonding wire and respectively covers two terminals of the bonding wire.

17 Claims, 4 Drawing Sheets

CHIP PACKAGE STRUCTURE AND MANUFACTURING METHOD THEREOF FOR EFFECTIVELY LOWERING MANUFACTURING COSTS AND IMPROVING YIELD AND RELIABILITY OF THE CHIP PACKAGE STRUCTURE

CROSS-REFERENCE TO RELATED APPLICATION

This application claims the priority benefit of Taiwan application serial no. 98112809, filed Apr. 17, 2009. The entirety of the above-mentioned patent application is hereby incorporated by reference herein and made a part of specification.

BACKGROUND OF THE INVENTION

1. Field of the Invention

The present application relates to a semiconductor structure and a manufacturing method thereof. More particularly, the present application relates to a chip package structure and a manufacturing method thereof.

2. Description of Related Art

A wire bonding technology applied for electrically connecting a chip to a carrier is a common chip package technology. Here, the carrier is a circuit substrate, for example. In general, the wire bonding technology is applied by forming a wire bump on a pad of the carrier with use of a stud bump machine, extending a wire upward to a certain distance, pulling the wire down to a contact pad of the chip, and then stitching the wire. By applying the wire bonding technology, the chip and the carrier can be electrically connected to each other through the bonding wire, and signals can be transmitted between the chip and the carrier through the bonding wire as well.

At present, a material of the common bonding wire includes aluminum, copper, or gold, and technologies of fabricating the aluminum bonding wire have developed vigorously and attained to maturity. Nonetheless, in consideration of certain characteristics of aluminum, such as high resistance and electromigration, copper with an electromigration resistivity 30 to 100 times higher than that of aluminum replaces aluminum to serve as the material of the bonding wire. To be more specific, thermal conductivities of copper, gold, and aluminum are approximately 394 W/m° K., 293 W/m° K., and 247 W/m° K., respectively. Therefore, it can be deduced that copper is characterized with better thermal conductivity than that of aluminum and that of gold. However, copper is prone to be oxidized, and utilization of copper as the material of the bonding wire likely gives rise to oxidation, such that reliability and strength of the bonding wire both decrease. On the other hand, given that gold having a lower thermal conductivity than that of copper is employed as the material of the bonding wire, the bonding wire is not subject to oxidation, whereas manufacturing costs of the bonding wire are raised due to high costs of gold in comparison with costs of copper and aluminum. As such, it is rather imperative to reduce the manufacturing costs of the bonding wire and simultaneously maintain reliability and strength of the bonding wire.

SUMMARY OF THE INVENTION

The present application is directed to a chip package structure and a manufacturing method thereof for effectively lowering manufacturing costs and improving yield and reliability of the chip package structure.

In the present application, a chip package structure including a circuit substrate, a chip, at least one bonding wire, and an adhesive layer is provided. The circuit substrate has a bonding surface and at least one pad disposed on the bonding surface. The chip is disposed on the bonding surface of the circuit substrate. Besides, the chip has an active surface away from the circuit substrate and at least one contact pad disposed on the active surface. The bonding wire is connected between the contact pad and the pad, such that the chip is electrically connected to the circuit substrate through the bonding wire. The bonding wire includes a copper layer, a nickel layer covering the copper layer, and a gold layer covering the nickel layer. The adhesive layer is disposed between the pad and the bonding wire and between the contact pad and the bonding wire. In addition, the adhesive layer respectively covers two terminals of the bonding wire.

According to an exemplary embodiment of the present invention, the bonding wire further includes a palladium layer disposed between the nickel layer and the gold layer.

According to an exemplary embodiment of the present invention, a material of the adhesive layer includes metal or metal resin. The metal includes gold or tin. The metal resin includes gold paste or tin paste.

According to an exemplary embodiment of the present invention, a thickness of the copper layer of the bonding wire is greater than a thickness of the nickel layer of the bonding wire, and the thickness of the nickel layer of the bonding wire is greater than a thickness of the gold layer of the bonding wire.

According to an exemplary embodiment of the present invention, a material of the pad includes gold or copper.

According to an exemplary embodiment of the present invention, the chip package structure further includes a molding compound. The molding compound is disposed on the bonding surface of the circuit substrate and covers a portion of the circuit substrate, the chip, the bonding wire, and the adhesive layer.

In the present application, a manufacturing method of a chip package structure is also provided. In the manufacturing method, first, a circuit substrate is provided. The circuit substrate has a bonding surface and at least one pad disposed on the bonding surface. Next, a chip is disposed on the bonding surface of the circuit substrate. The chip has an active surface away from the circuit substrate and at least one contact pad disposed on the active surface. Thereafter, an adhesive layer is formed on the pad and the contact pad. At least one bonding wire is then formed to connect the pad and the contact pad, such that the chip is electrically connected to the circuit substrate through the bonding wire. The bonding wire includes a copper layer, a nickel layer covering the copper layer, and a gold layer covering the nickel layer. The adhesive layer covers two terminals of the bonding wire, such that the two terminals of the bonding wire can be bonded to the pad and the contact pad.

According to an exemplary embodiment of the present invention, the adhesive layer is formed by performing a dispensing method.

According to an exemplary embodiment of the present invention, a material of the adhesive layer includes metal or metal resin. The metal includes gold or tin. The metal resin includes gold paste or tin paste.

According to an exemplary embodiment of the present invention, the bonding wire further includes a palladium layer disposed between the nickel layer and the gold layer.

According to an exemplary embodiment of the present invention, a method of connecting the pad and the contact pad through the bonding wire and covering the two terminals of the bonding wire with the adhesive layer includes performing an ultrasonic bonding process.

According to an exemplary embodiment of the present invention, the ultrasonic bonding process is performed under a pressure range from 85 g/cm² to 95 g/cm².

According to an exemplary embodiment of the present invention, the ultrasonic bonding process is performed for a bonding time period range from 10 milliseconds to 15 milliseconds.

According to an exemplary embodiment of the present invention, the ultrasonic bonding process is performed with energy range from 90 mw to 110 mw.

According to an exemplary embodiment of the present invention, the ultrasonic bonding process is performed at a temperature range from 215 to 225 preferably from 219 to 221.

According to an exemplary embodiment of the present invention, a material of the pad includes gold or copper.

According to an exemplary embodiment of the present invention, after the bonding wire is formed, the manufacturing method of the chip package structure further includes forming a molding compound to cover a portion of the circuit board, the chip, the bonding wire, and the adhesive layer.

Based on the above, the bonding wire of the chip package structure in the present application is composed of a copper layer, a nickel layer, and a gold layer. Besides, an adhesive layer is formed between the bonding wire and the pad of the circuit substrate and between the bonding wire and the contact pad of the chip. In addition, the bonding strength among the bonding wire, the pad, the contact pad, and the adhesive layer is enhanced by performing an ultrasonic bonding process. Accordingly, compared with the conventional bonding wire, the bonding wire of the present application not only can effectively reduce the manufacturing costs of the chip package structure but also can feasibly improve strength, reliability, and yield of the chip package structure.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

Figure 1A:
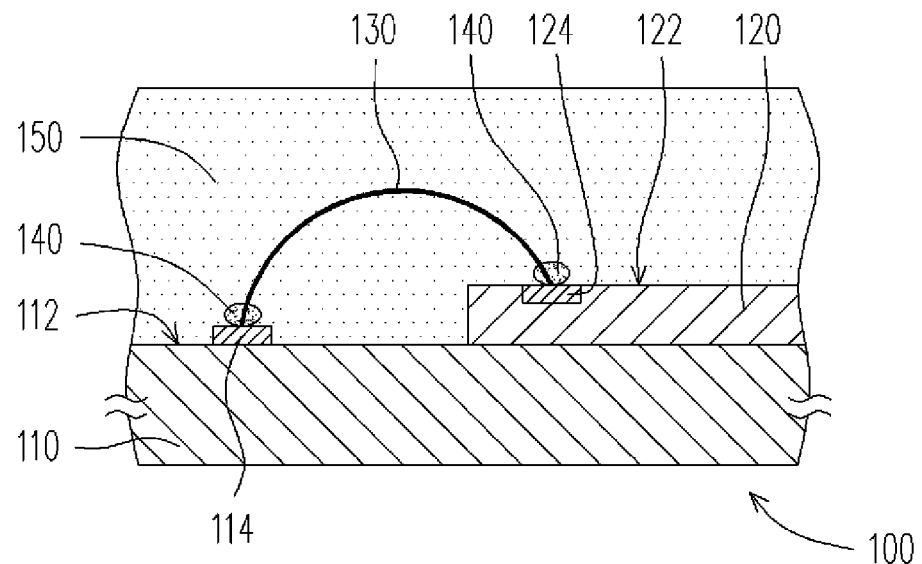
FIG. 1A is a schematic view of a chip package structure according to an exemplary embodiment of the present invention.
Figure 1B:
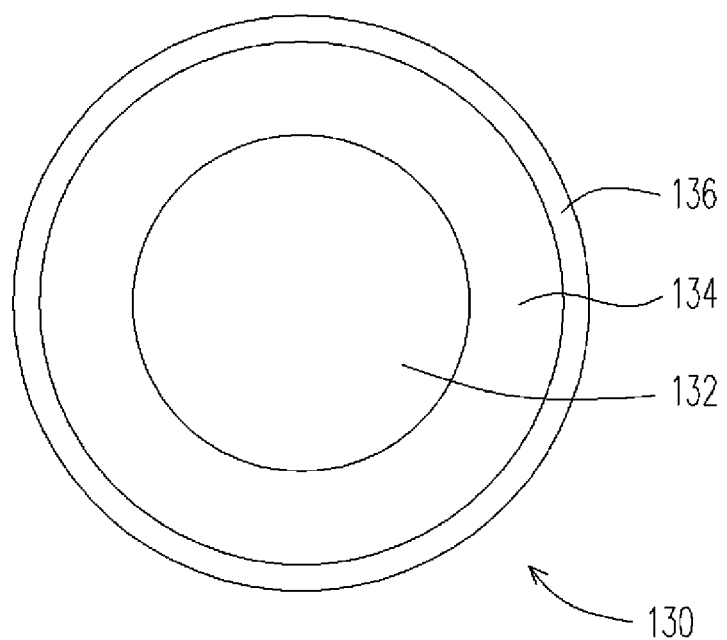
FIG. 1B is a schematic top view of a bonding wire depicted in FIG. 1A.

FIG. 1A is a schematic view of a chip package structure according to an exemplary embodiment of the present invention. FIG. 1B is a schematic top view of a bonding wire depicted in FIG. 1A. As shown in FIGS. 1A and 1B, in the present embodiment, the chip package structure 100 includes a circuit substrate 110, a chip 120, at least one bonding wire 130 (only one is schematically depicted in FIG. 1A), and an adhesive layer 140.

In detail, the circuit substrate 110 has a bonding surface 112 and at least one pad 114 (only one is schematically depicted in FIG. 1A) disposed on the bonding surface 112. According to the present embodiment, the circuit substrate 110 is, for instance, a printed circuit board (PCB). A material of the pad 114 is gold or copper, for example. In general, given that the material of the pad 114 is copper, a surface of the pad 114 is frequently covered by a nickel layer and a gold layer to prevent oxidation and other environmental conditions from affecting the chip package structure 100.

The chip 120 is disposed on the bonding surface 112 of the circuit substrate 110. The chip 120 has an active surface 122 away from the circuit substrate 110 and at least one contact pad 124 (only one is schematically depicted in FIG. 1A) disposed on the active surface 122 and located at the periphery of the chip 120.

The bonding wire 130 is connected between the contact pad 124 of the chip 120 and the pad 114 of the circuit substrate 110, such that the chip 120 is electrically connected to the circuit substrate 110 through the bonding wire 130. Particularly, according to the present embodiment, the bonding wire 130 includes a copper layer 132, a nickel layer 134 covering the copper layer 132, and a gold layer 136 covering the nickel layer 134. A thickness of the copper layer 132 of the bonding wire 130 is greater than a thickness of the nickel layer 134 of the bonding wire 130, and the thickness of the nickel layer 134 of the bonding wire 130 is greater than a thickness of the gold layer 136 of the bonding wire 130. In a preferred embodiment, for example, the thickness of the copper layer 132 of the bonding wire 130 ranges from 15 µm to 30 µm, the thickness of the nickel layer 134 of the bonding wire 130 ranges from 1 µm to 20 µm, and the thickness of the gold layer 136 of the bonding wire 130 ranges from 0.1 µm to 1 µm.

According to the present embodiment, the bonding wire 130 is composed of the copper layer 132, the nickel layer 134 covering the copper layer 132, and the gold layer 136 covering the nickel layer 134, and the thickness of the gold layer 136 is far less than the thickness of the copper layer 132. Thereby, manufacturing costs of the bonding wire 130 can be reduced in an effective manner. Additionally, the gold layer 136 is the outermost layer of the bonding wire 130 and is oxidation-resistant, which efficaciously brings about an improvement in reliability and strength of the bonding wire 130. On the other hand, the copper layer 132 of the bonding wire 130 which has a greater thickness than the gold layer 136 has a thermal conductivity of 394 W/m° K., such that heat generation by the chip 120 during operation can be partially dissipated to external surroundings rapidly and effectively by the bonding wire 130 through certain heat transmission mechanisms, such as heat convection, heat radiation, and so on. Besides, the nickel layer 134 disposed between the copper layer 132 and the gold layer 136 can prevent an ion exchange reaction caused by putting copper ions and gold ions in contact.

Figure 1C:
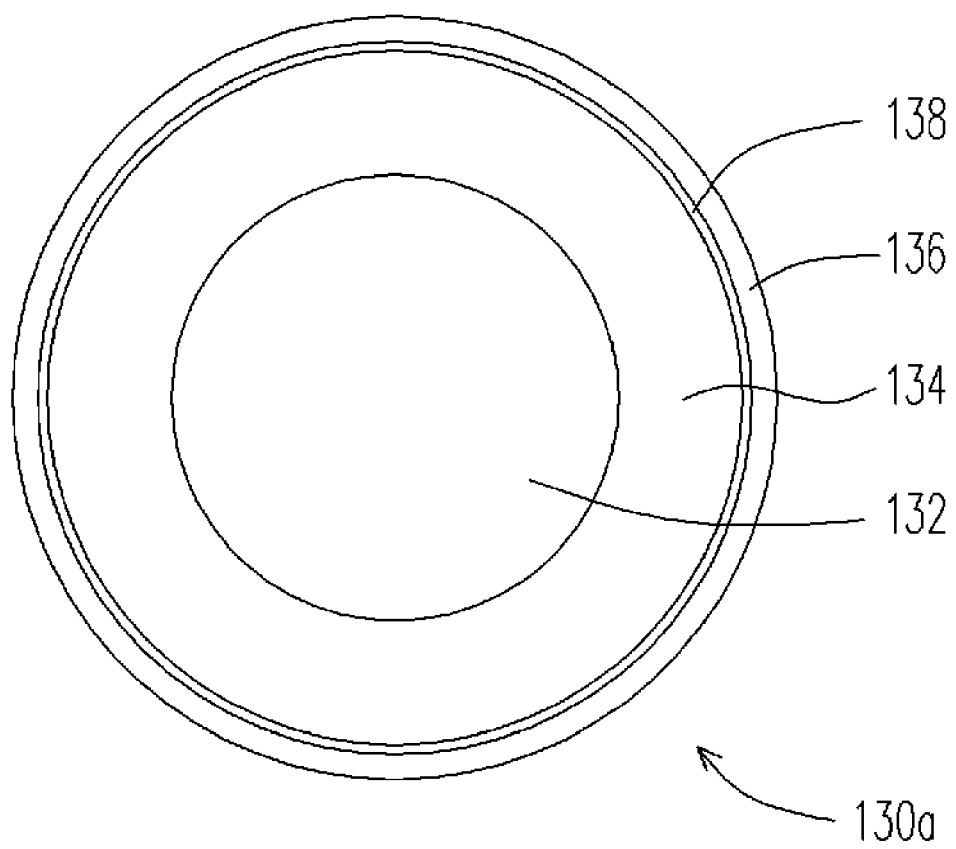
FIG. 1C is a schematic top view of a bonding wire according to another exemplary embodiment of the present invention.

Note that the types of the bonding wire 130 are not limited in the present application. Notwithstanding the bonding wire 130 of the present embodiment is composed of the copper layer 132, the nickel layer 134, and the gold layer 136, other structural designs equivalently capable of reducing costs and preventing oxidation are also applicable in the present application. For instance, as indicated in FIG. 1C, a bonding wire 130a further includes a palladium layer 138 disposed between the nickel layer 134 and the gold layer 136. Namely, the bonding wire 130a is composed of the copper layer 132, the nickel layer 134, the gold layer 136, and the palladium layer 138. Preferably, an exemplary thickness of the palladium layer 138 ranges from 1 nm to 10 nm, which is still a part of the technical proposal of the present invention and does not depart from the protection scope of the invention.

The adhesive layer 140 is disposed on the pad 114 of the circuit substrate 110 and the contact pad 124 of the chip 120. Besides, the adhesive layer 140 covers two terminals of the bonding wire 130. Since the adhesive layer 140 is disposed between the bonding wire 130 and the pad 114 of the circuit substrate 110 and between the bonding wire 130 and the contact pad 124 of the chip 120, the bonding strength of the bonding wire 130 can be enhanced during implementation of a wire bonding process. According to the present embodiment, a material of the adhesive layer 140 includes metal or metal resin, wherein the metal includes gold or tin, and the metal resin includes gold paste or tin paste. In a preferred embodiment, the material of the adhesive layer 140 is, for example, the gold paste or the tin paste.

Moreover, the chip package structure 100 of the present embodiment further includes a molding compound 150 disposed on the bonding surface 112 of the circuit substrate 110. The molding compound 150 covers a portion of the circuit substrate 110, the chip 120, the bonding wire 130, the pad 114, and the adhesive layer 140, so as to prevent the chip 120 and the bonding wire 130 from being affected by external temperature, moisture, and dust.

In brief, the bonding wire 130 of the chip package structure 100 in the present embodiment is composed of the copper layer 132, the nickel layer 134, and the gold layer 136; the adhesive layer 140 is formed between the bonding wire 130 and the pad 114 of the circuit substrate 110 and between the bonding wire 130 and the contact pad 124 of the chip 120. Hence, compared with the conventional bonding wire, the bonding wire 130 of the present embodiment not only can effectively reduce the manufacturing costs of the chip package structure 100 but also can feasibly improve strength, reliability, and yield of the chip package structure 100.

The chip package structure 100 is described above, while a manufacturing method of a chip package structure is not yet introduced in the present application. An exemplary embodiment is therefore provided along with FIGS. 2A to 2E to elaborate the manufacturing method of the chip package structure 100.

Figure 2A:
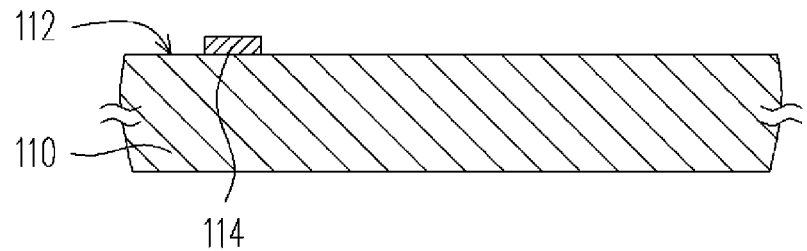
FIGS. 2A to 2E schematically illustrate a manufacturing method of a chip package structure according to an exemplary embodiment of the present invention.

In particular, FIGS. 2A to 2E schematically illustrate a manufacturing method of a chip package structure according to an exemplary embodiment of the present invention. As shown in FIG. 2A, in the manufacturing method of the chip package structure 100 according to the present embodiment, a circuit substrate 110 is provided first. The circuit substrate 110 has a bonding surface 112 and at least one pad 114 (only one is schematically depicted in FIG. 2A) disposed on the bonding surface 112. In the present embodiment, the circuit substrate 110 is, for example, a PCB, and a material of the pad 114 is gold or copper. Generally, given that the material of the pad 114 is copper, a surface of the pad 114 is often covered by a nickel layer and a gold layer to prevent oxidation and other environmental conditions from affecting the chip package structure 100.

Figure 2B:
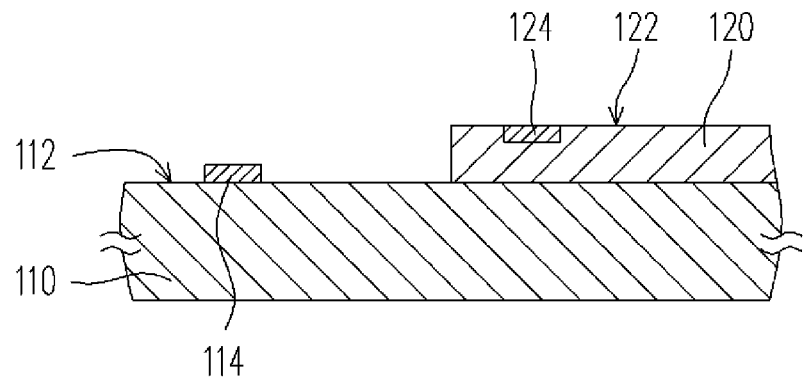

Next, as indicated in FIG. 2B, a chip 120 is disposed on the bonding surface 112 of the circuit substrate 110. The chip 120 has an active surface 122 away from the circuit substrate 110 and at least one contact pad 124 (only one is schematically depicted in FIG. 2B) disposed on the active surface 122 and located at the periphery of the chip 120.

Figure 2C:
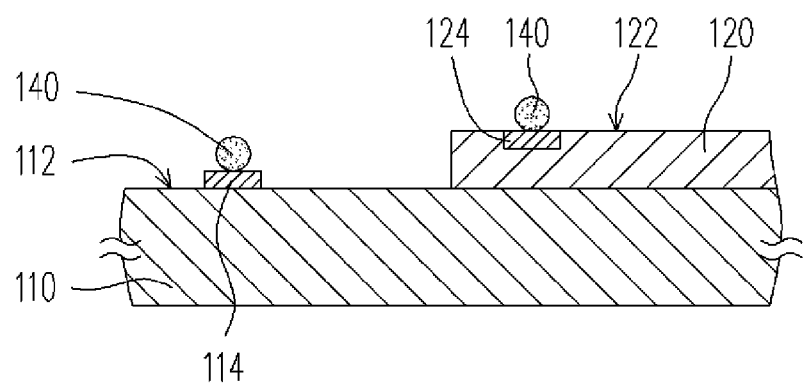

With reference to FIG. 2C, an adhesive layer 140 is then formed on the pad 114 of the circuit substrate 110 and the contact pad 124 of the chip 120. The adhesive layer 140 is formed by performing a dispensing method. A material of the adhesive layer 140 includes metal or metal resin, wherein the metal includes gold or tin, and the metal resin includes gold paste or tin paste. In a preferred embodiment, the material of the adhesive layer 140 is, for example, the gold paste or the tin paste. It should be mentioned that the adhesive layer 140 can be bonded to the pad 114 and a subsequently formed bonding wire 130 through eutectic bonding.

Figure 2D:
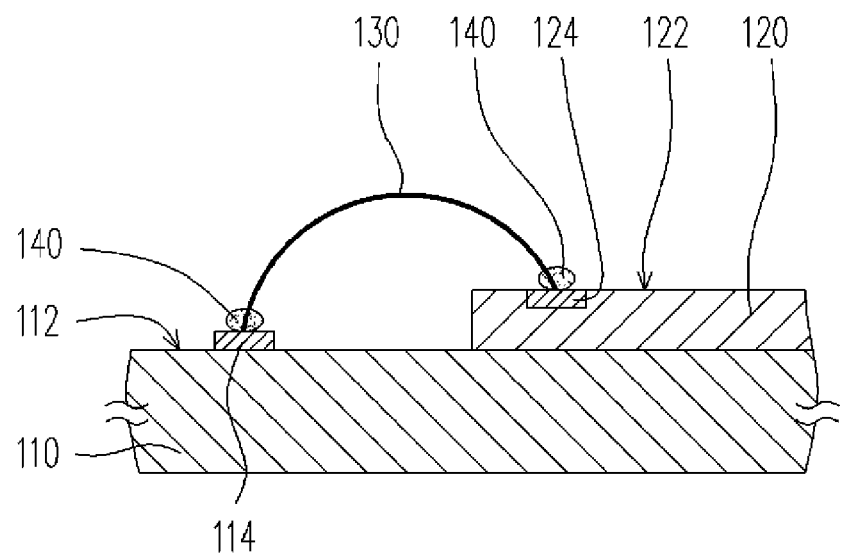

Thereafter, as shown in FIGS. 1B and 2D, at least one bonding wire 130 (only one is schematically depicted in FIG. 2D) to connect the contact pad 124 of the chip 120 and the pad 114 of the circuit substrate 110. Thereby, the chip 120 is electrically connected to the circuit substrate 110 through the bonding wire 130. Particularly, according to the present embodiment, the bonding wire 130 includes a copper layer 132, a nickel layer 134 covering the copper layer 132, and a gold layer 136 covering the nickel layer 134. The adhesive layer 140 covers two terminals of the bonding wire 130. A thickness of the copper layer 132 of the bonding wire 130 is greater than a thickness of the nickel layer 134 of the bonding wire 130, and the thickness of the nickel layer 134 of the bonding wire 130 is greater than a thickness of the gold layer 136 of the bonding wire 130.

In a preferred embodiment, for example, the thickness of the copper layer 132 of the bonding wire 130 ranges from 15 μm to 30 μm, preferably from 20 μm to 25 μm. The thickness of the nickel layer 134 of the bonding wire 130 ranges from 1 μm to 20 μm, for example, and the thickness of the gold layer 136 of the bonding wire 130 ranges from 0.1 μm to 1 μm, for example. In other embodiments as indicated in FIG. 1C, a bonding wire 130a can further include a palladium layer 138 disposed between the nickel layer 134 and the gold layer 136. Namely, the bonding wire 130a is formed by the copper layer 132, the nickel layer 134, the gold layer 136, and the palladium layer 138. Preferably, an exemplary thickness of the palladium layer 138 ranges from 1 nm to 10 nm, which is still a part of the technical proposal of the present invention and does not depart from the protection scope of the invention.

Further, in the present embodiment, a method of connecting the pad 114 of the circuit substrate 110 and the contact pad 124 of the chip 120 through the bonding wire 130 and covering the two terminals of the bonding wire 130 with the adhesive layer 140 includes performing an ultrasonic bonding process. The ultrasonic bonding process is performed with an energy from 90 mw to 110 mw under a pressure from 85 g/cm$^2$ to 95 g/cm$^2$ at a temperature from 215 to 225 (preferably from 219 to 221) for a bonding time period from 10 milliseconds to 15 milliseconds. The bonding wire 130, the pad 114, the contact pad 124, and the adhesive layer 140 are bonded through implementation of the ultrasonic bonding process. Accordingly, when the material of the pad 114 is gold (or gold paste), and the material of the adhesive layer 140 is gold as well, the bonding wire 130, the pad 114, the contact pad 124, and the adhesive layer 140 are electrically connected one another through gold-gold eutectic bonding. On the other hand, when the material of the pad 114 and the contact pad 124 is gold, and the material of the adhesive layer 140 is tin (or tin paste), the bonding wire 130, the pad 114, and the adhesive layer 140 are electrically connected one another through tin adhesion. That is to say, eutectic bonding arises on contact surfaces of the bonding wire 130, the pad 114, and the adhesive layer 140, and thereby the bonding strength can be further enhanced.

Figure 2E:
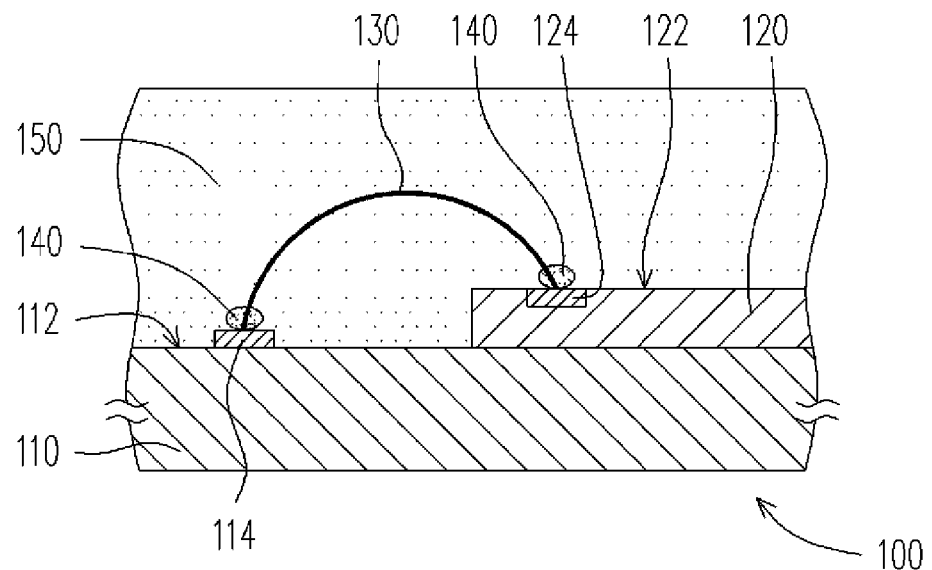

Finally, referring to FIG. 2E, a molding compound 150 is formed to cover a portion of the circuit substrate 110, the chip 120, the bonding wire 130, the pad 114, and the adhesive layer 140. As such, the chip 120 and the bonding wire 130 can be precluded from being affected by external temperature, moisture, and dust. So far, the chip package structure 100 is completely formed.

To sum up, according to the manufacturing method of the chip package structure 100 of the present embodiment, the adhesive layer 140 is formed on the pad 114 of the circuit substrate 110 and the contact pad 124 of the chip 120 prior to the formation of the bonding wire 130 for electrical connection. Afterward, the eutectic bonding effect is achieved on the contact surfaces of the bonding wire 130, the pad 114, the contact pad 124, and the adhesive layer 140 by performing the ultrasonic bonding process. Thereby, the bonding strength between the bonding wire 130 and the pad 114 and between the bonding wire 130 and the contact pad 124 can be enhanced. Additionally, yield of the manufacturing process can be improved, and so can yield and reliability of the chip package structure 100.

In light of the foregoing, the bonding wire of the chip package structure provided in the present application is composed of a copper layer, a nickel layer, and a gold layer. Alternatively, the bonding wire of the chip package structure is composed of a copper layer, a nickel layer, a gold layer, and a palladium layer. Besides, the thickness of the copper layer is much greater than that of the gold layer, and the gold layer is the outermost layer of the bonding wire. Accordingly, compared with the conventional bonding wire, the bonding wire of the present application not only can effectively reduce the manufacturing costs of the chip package structure but also can prevent oxidation and feasibly improve strength and reliability of the chip package structure. Moreover, the bonding strength among the bonding wire, the pad, and the adhesive layer is enhanced by performing an ultrasonic bonding process in the manufacturing method of the chip package structure of the present application. Therefore, yield of the manufacturing process can be increased in an effective manner, and so can yield and reliability of the chip package structure.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A chip package structure, comprising:
    a circuit substrate having a bonding surface and at least one pad disposed on the bonding surface;
    a chip disposed on the bonding surface of the circuit substrate, the chip having an active surface away from the circuit substrate and at least one contact pad disposed on the active surface;
    at least one bonding wire connects the at least one contact pad and the at least one pad, such that the chip is electrically connected to the circuit substrate through the at least one bonding wire, wherein the at least one bonding wire comprises a copper layer, a nickel layer covering the copper layer, and a gold layer covering the nickel layer; and
    an adhesive layer disposed between the at least one pad and the at least one bonding wire and between the at least one contact pad and the at least one bonding wire, the adhesive layer covering two terminals of the at least one bonding wire, wherein a material of the adhesive layer comprises metal or metal resin, and the metal resin comprises gold paste or tin paste.

2. The chip package structure as claimed in claim 1, wherein the at least one bonding wire further comprises a palladium layer disposed between the nickel layer and the gold layer.

3. The chip package structure as claimed in claim 1, wherein the metal comprises gold or tin.

4. The chip package structure as claimed in claim 1, wherein a thickness of the copper layer of the at least one bonding wire is greater than a thickness of the nickel layer of the at least one bonding wire, and the thickness of the nickel layer of the at least one bonding wire is greater than a thickness of the gold layer of the at least one bonding wire.

5. The chip package structure as claimed in claim 1, wherein a material of the at least one pad of the circuit substrate comprises gold or copper.

6. The chip package structure as claimed in claim 1, further comprising a molding compound disposed on the bonding surface of the circuit substrate and covering a portion of the circuit substrate, the chip, the at least one bonding wire, and the adhesive layer.

7. A manufacturing method of a chip package structure, comprising:
    providing a circuit substrate having a bonding surface and at least one pad disposed on the bonding surface;
    disposing a chip on the bonding surface of the circuit substrate, the chip having an active surface away from the circuit substrate and at least one contact pad disposed on the active surface;
    forming an adhesive layer on the at least one pad and the at least one contact pad, wherein a material of the adhesive layer comprises metal or metal resin and the metal resin comprises gold paste or tin paste; and
    forming at least one bonding wire connected between the at least one contact pad and the at least one pad, such that the chip is electrically connected to the circuit substrate through the at least one bonding wire, wherein the at least one bonding wire comprises a copper layer, a nickel layer covering the copper layer, and a gold layer covering the nickel layer, and the adhesive layer covers two terminals of the at least one bonding wire.

8. The manufacturing method of the chip package structure as claimed in claim 7, wherein the adhesive layer is formed by performing a dispensing method.

9. The manufacturing method of the chip package structure as claimed in claim 7, wherein the metal comprises gold or tin.

10. The manufacturing method of the chip package structure as claimed in claim 7, wherein the at least one bonding wire further comprises a palladium layer disposed between the nickel layer and the gold layer.

11. The manufacturing method of the chip package structure as claimed in claim 7, wherein a method of connecting the at least one pad and the at least one contact pad through the at least one bonding wire and covering the two terminals of the at least one bonding wire with the adhesive layer comprises performing an ultrasonic bonding process.

12. The manufacturing method of the chip package structure as claimed in claim 11, wherein the ultrasonic bonding process is performed under a pressure ranging from 85 g/cm2 to 95 g/cm2.

13. The manufacturing method of the chip package structure as claimed in claim 11, wherein the ultrasonic bonding process is performed for a bonding time period ranging from 10 milliseconds to 15 milliseconds.

14. The manufacturing method of the chip package structure as claimed in claim 11, wherein the ultrasonic bonding process is performed with energy ranging from 90 mw to 110 mw.

15. The manufacturing method of the chip package structure as claimed in claim 11, wherein the ultrasonic bonding process is performed at a temperature ranging from 215 to 225.

16. The manufacturing method of the chip package structure as claimed in claim 7, wherein a material of the at least one pad comprises gold or copper.

17. The manufacturing method of the chip package structure as claimed in claim 7, further comprising forming a molding compound to cover a portion of the circuit board, the chip, the at least one bonding wire, and the adhesive layer after the at least one bonding wire is formed.

* * * * *